United States Patent
Iskander et al.

(10) Patent No.: US 7,221,558 B2
(45) Date of Patent: May 22, 2007

(54) GALVANICALLY ISOLATED DELIVERY OF POWER TO HIGH VOLTAGE CIRCUITS PARTS

(75) Inventors: Stephen Mark Iskander, Essex (GB); David Bernard Fox, Essex (GB); Robert Richardson, Essex (GB)

(73) Assignee: E2V Technologies (UK) Limited, Chelmsford (GB)

( * ) Notice: Subject to any disclaimer, the term of this patent is extended or adjusted under 35 U.S.C. 154(b) by 460 days.

(21) Appl. No.: 10/480,528

(22) PCT Filed: Jun. 14, 2002

(86) PCT No.: PCT/GB02/02729

§ 371 (c)(1),
(2), (4) Date: Dec. 12, 2003

(87) PCT Pub. No.: WO02/104076

PCT Pub. Date: Dec. 27, 2002

(65) Prior Publication Data

US 2004/0190231 A1 Sep. 30, 2004

(30) Foreign Application Priority Data

Jun. 15, 2001 (GB) ................................. 0114676.0

(51) Int. Cl.
*H02B 1/26* (2006.01)

(52) U.S. Cl. .......................... 361/623; 336/90; 336/92; 320/108

(58) Field of Classification Search ........ 361/622–623; 336/90, 92; 307/89, 91; 320/108
See application file for complete search history.

(56) References Cited

U.S. PATENT DOCUMENTS

| 3,376,523 | A |   | 4/1968  | Kerns |
|-----------|---|---|---------|-------|
| 4,471,440 | A | * | 9/1984  | Check, Jr. .................. 705/401 |
| 4,481,423 | A |   | 11/1984 | Conway |
| 4,652,846 | A | * | 3/1987  | Sobottka ................... 336/84 C |
| 5,025,489 | A | * | 6/1991  | Yamaguchi ................ 219/760 |
| 5,301,096 | A | * | 4/1994  | Klontz et al. ............... 363/37 |
| 5,422,519 | A |   | 6/1995  | Russell |
| 5,550,452 | A | * | 8/1996  | Shirai et al. ............... 320/108 |
| 5,949,155 | A | * | 9/1999  | Tamura et al. ............. 307/107 |
| 6,054,780 | A | * | 4/2000  | Haigh et al. ................ 307/91 |
| 6,108,216 | A | * | 8/2000  | Abe et al. ................... 363/17 |

(Continued)

FOREIGN PATENT DOCUMENTS

DE        37 00 488        7/1988

(Continued)

*Primary Examiner*—Michael Datskovsky
*Assistant Examiner*—Robert J. Hoffberg
(74) *Attorney, Agent, or Firm*—Venable LLP; Robert Kinberg; Steven J. Schwarz

(57) ABSTRACT

A high voltage switching apparatus delivers kV pulses to a load such as a magnetron. The switching apparatus comprises a switching stack surrounded by capacitors and both arranged within a housing. Lt power is supplied to the stack, e.g. for control electronics, by magnetic coupling across a non-conducting wall of the housing. Annular inserts are arranged on either side of the wall. Each insert receives a transformer core and winding. The bottom surfaces of the inserts carry a conductive coating to minimise electric stresses. Ht power is also supplied through the wall.

14 Claims, 3 Drawing Sheets

U.S. PATENT DOCUMENTS

| | | | |
|---|---|---|---|
| 6,208,531 B1 * | 3/2001 | Vinciarelli et al. | 363/21.07 |
| 6,291,907 B1 * | 9/2001 | Haigh et al. | 307/91 |
| 6,301,128 B1 * | 10/2001 | Jang et al. | 363/17 |
| 6,396,332 B2 * | 5/2002 | Richardson | 327/384 |
| 6,504,732 B2 * | 1/2003 | Abe | 363/17 |

FOREIGN PATENT DOCUMENTS

| | | |
|---|---|---|
| EP | 0 291 093 | 11/1988 |
| EP | 0 508 521 | 10/1992 |
| FR | 2 061 547 | 6/1971 |
| FR | 2 160 688 | 6/1973 |
| GB | 0 499 037 | 1/1939 |
| GB | 2 020 116 | 11/1979 |
| GB | 2 356 752 | 5/2001 |
| GB | 2 356 753 | 5/2001 |
| JP | 2000-78763 * | 9/1998 |
| WO | WO 01/56045 | 8/2001 |

* cited by examiner

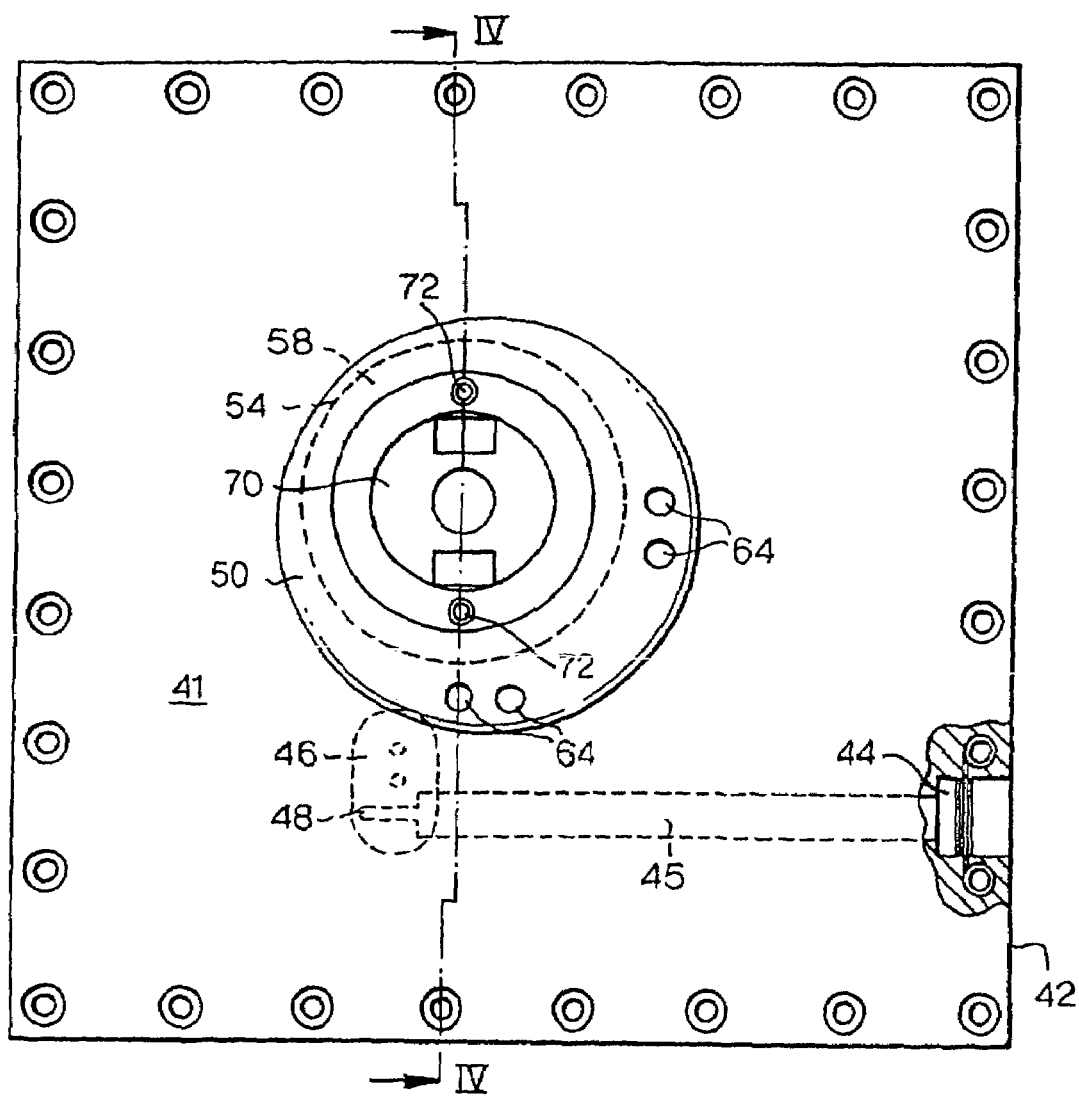

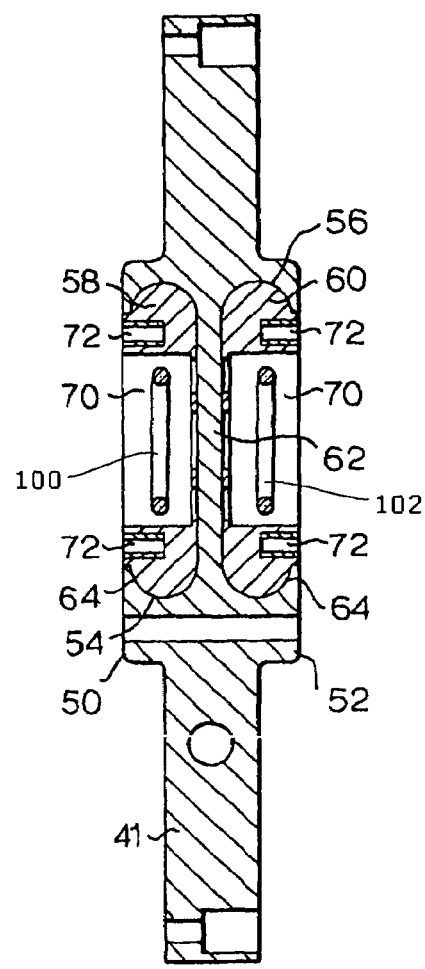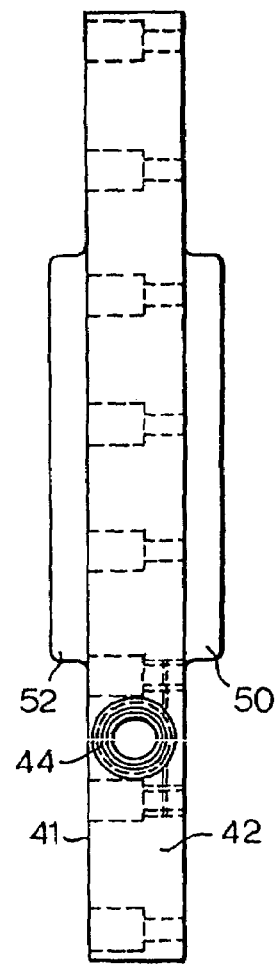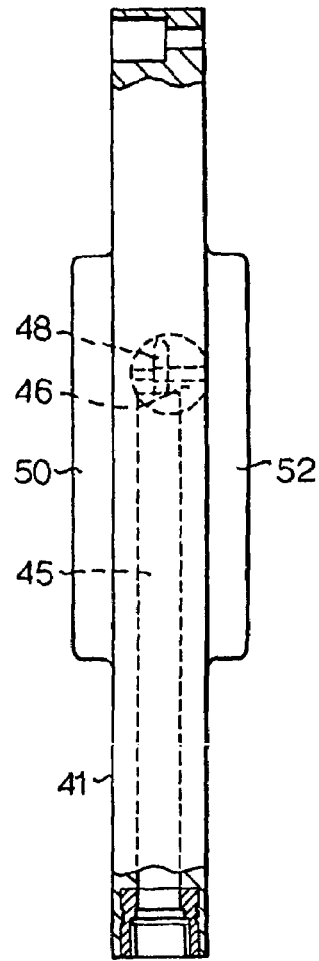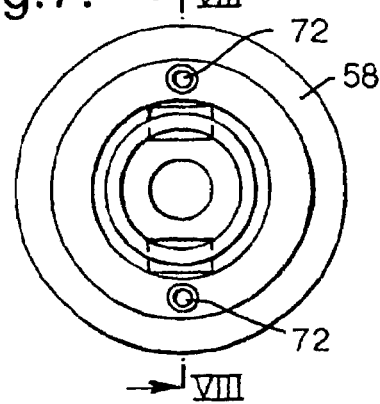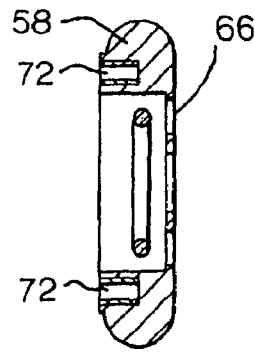

GALVANICALLY ISOLATED DELIVERY OF POWER TO HIGH VOLTAGE CIRCUITS PARTS

This invention relates to the delivery of power to high voltage devices, and in particular to the delivering of lt power to eht devices, for example to power control circuitry.

Our UK patent applications GB 9928074.5 and GB 9926049.7 describe a pulsed switching apparatus for an eht load such as a magnetron. A stack of FET switch modules are arranged in an oil filled chamber surrounded by four capacitors which are mounted within a plastics housing. The switch stack receives a eht supply, typically at about −55 kV and delivers a series of eht pulses to the magnetron. The switch also includes various control circuitry which operates at it voltages. This circuitry controls functions such as triggering of the FET switches.

There is a problem in how to deliver the lt power to the control circuitry which is at the eht potential.

The invention aims to overcome this problem and in its broadest form delivers power by magnetic coupling across a wall of a housing.

More specifically, there is provided a high voltage apparatus comprising a means for delivering high voltages to a load, and a housing in which the high voltage delivery means is arranged, wherein the housing includes a plurality of walls, one of which is non-conductive and includes a transformer for delivering a low voltage supply to a switch system, the transformer having a primary coil and core arranged in a first insert on a first side of the wall and a secondary coil and core arranged in a second insert on a second side of the wall, whereby power can be magnetically coupled across the wall, and wherein the first and second inserts have a conductive coating formed on the surfaces thereof and are arranged between the first side of the wall and the primary coil and core, and the second side of the wall and the secondary coil and core, and wherein the inserts are shaped to minimise electric stresses.

Embodiments of the invention have the advantage that lt power can be delivered to devices that are at an eht potential. The use of magnetic coupling across a non conductive wall of the housing, preferably an end wall, avoids the need for seals, gaskets and the like which can give rise to oil leaks and which are generally unsatisfactory.

The conductive coating helps to dissipate electric stresses and enables relatively non-precision components to be used, for example, standard transformer cores which have sharp edges which would otherwise generate unacceptable electric stresses.

Preferably, the inserts are arranged snugly in chambers on either side of the wall. The use of inserts is a convenient way of introducing the coating into the wall.

Preferably, the inserts are annular and have a smooth concave outer surface with a flat face on which the conductive coating is deposited. This arrangement helps to minimise electric stresses.

The conductive coating may extend over the side wall of the inserts.

Preferably the inserts have a chamber in which the coil and core are received. The coil and core are therefore spaced apart from the conductive coating by the thickness of a bottom wall of the inserts.

An embodiment of the invention will now be described, by way of example, and with reference to the accompanying drawings, in which:

FIG. 3 is a plan of an end plate for the switching mechanism of FIG. 1 and embodying the invention;

FIG. 4 is a cross section of the line IV—IV in FIG. 3;

FIG. 5 is a side view of the end plate of FIG. 3;

FIG. 6 is a top view of the end plate of FIG. 3;

FIG. 7 is a plan of an annular insert mounted in the end plate of FIG. 3; and FIG. 8 is a cross section on the line VIII—VIII in FIG. 7.

Figure 1:
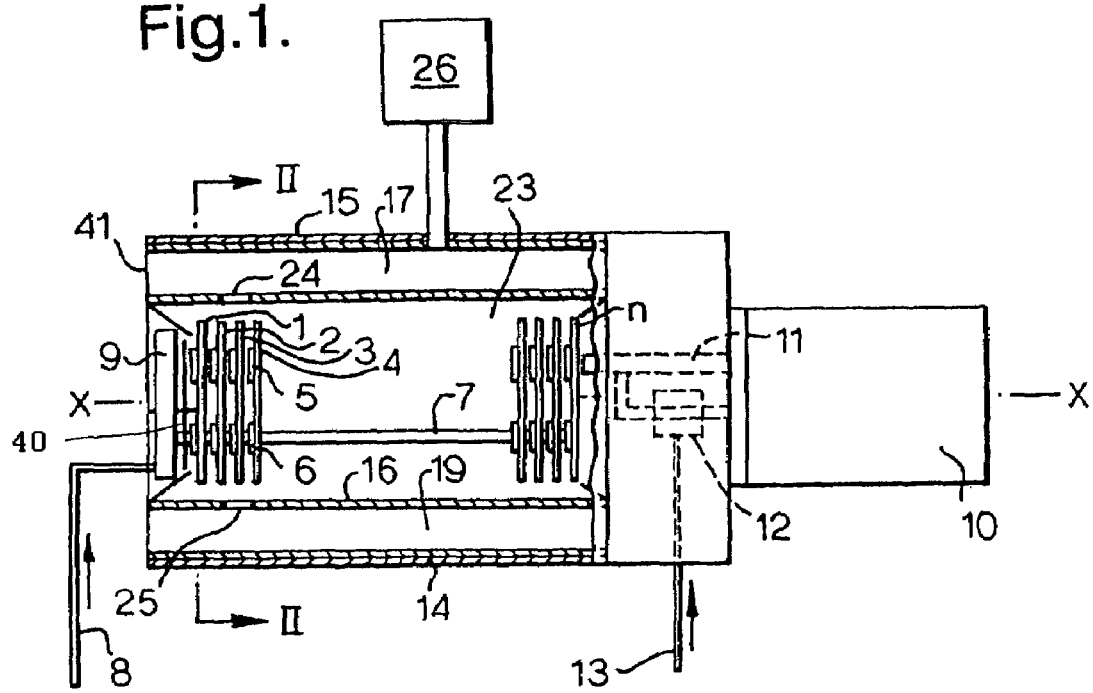
FIG. 1 is a schematic longitudinal view of a high voltage switching mechanism.
Figure 2:
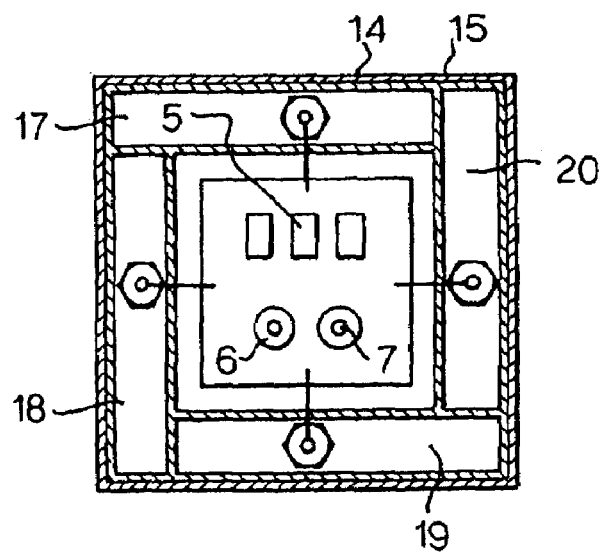
FIG. 2 is a schematic cross-section on the line II to II in FIG. 1.

FIGS. 1 and 2 show the switching mechanism disclosed in our earlier applications GB9928074.5 and GB9928049.7. The mechanism provides high voltage pulses to a high voltage load, such as a magnetron, by switching a capacitance. The switching is triggered by trigger pulses derived from a high voltage supply and the capacitance is also charged by that supply.

The switching arrangement shown in FIGS. 1 and 2 comprises a switch stack arranged within a chamber surrounded by a plurality of capacitances. The switch stack comprises a number of FET modules 1, 2, 3, 4, . . . .n, each of which includes one or more FET switches. There may be, for example, 75 FET modules in the stack and each module may include three FET switches. The modules are mounted in close proximity to one another and are stacked along the axis in FIG. 1. As well as the FET switch, each module includes a secondary transformer winding 6 with a common primary winding 7 extending along the length of the axis to act as the primary for each module. The primary is used to provide power and drive pulses to the FET switches. Power to the switching arrangement is applied from a source 8 to a trigger driver 9 at the high voltage end of the stack which is maintained at −55kV. The trigger driver is formed as a module of similar dimensions to the FET modules and forms the end module of the stack. The load 10, for example a magnetron, is connected to an output 11 of the switching mechanism to receive pulses from the switching mechanism. The output 11 also provides an output 12 to a heater transformer for heating the magnetron cathode. The power for the transformer is provided from a power source 13.

The switching mechanism is arranged within a housing 14. The housing is formed of a non-conductive material such as a plastics material and comprises outer and inner walls 15, 16 defining an annular chamber therebetween, and an interior chamber 23 bounded by the inner walls and in which the switching stack is arranged. The annular chamber and the interior chamber 23 communicate via apertures 24, 25 in the inner wall 16.

As can be seen from FIG. 2, the housing and the annular and interior chambers are rectangular in cross section. Four capacitors 17, 18, 19, 20 are arranged in the annular chamber one on each side, and extend along the length of the chamber shielding the switching mechanism. The capacitors are connected at the high voltage end to the first switch module and to the load 10 at the low voltage end, which may be at ground. The capacitors each comprise a plurality of parallel plates forming capacitor elements which are interconnected so that a nominally linear voltage gradient appears from the power supply end to the zero volt end. The capacitors may each be 0.15 µf.

The unit is oil filled for heat dissipation and insulation. Oil can pass between the annular and inner chambers through passageways 24, 25. An expansion tank 26 is connected to the chambers which includes a diaphragm, and which moves with the changes in oil volume, for example due to temperature changes.

The switching stack also comprises a control module 40 which is mounted on the stack between the trigger power supply module and the first FET module 1 and which is of similar dimensions to the FET modules. The control module controls triggering of the FET switches and floats at the high voltage of −55 kV but requires its own lt power supply to operate; the control circuitry. It will be appreciated from FIGS. 1 and 2 that there is very limited space for the necessary transformer to provide that power supply and, also, a need to isolate the LT voltage from the −55 kV supply.

The arrangement of FIGS. 3 to 8 provide a solution to these problems.

FIGS. 3 to 6 illustrate an end plate 41 of the casing. The end plate 41 is fixed to the casing at the high voltage end by any convenient method such as welding to close the annular and interior chambers. The end plate is made from a non-conductive material, preferably a plastics material such as epoxy resin.

The high voltage power supply is provided to the interior chamber 23 through a side wall 42 of the end plate 41. A circular screw fixing 44 is provided to receive a threaded coaxial connector. An interior passageway 45 extends through the end plate to an anchor plate 46 which includes a socket 48 into which the central conductor of a coaxial power cable is received. The anchor plate, which is of a convenient conductive material such as brass, is accessible on the inside face of the end plate by which the power supply can be connected to thee trigger driver 9. In FIG. 4, the passageway 45 is omitted for clarity.

It can be seen from FIGS. 3 to 6 that the end plate has a pair of coaxial, centrally located circular projections extending one from each face of the end plate. Each projection 50, 52 includes an annular chamber 54, 56 in which is received an annular insert 58, 60 shown in FIGS. 7 and 8. The annular chambers 54 and 56 are spaced apart and are separated by a thin wall portion 62 of the end plate, (FIG. 4). This may typically be 8 mm in diameter. The two annular chambers are coaxial but offset from the centre of the plate and are not coaxial with the two projections 50, 52. The projections each have two pairs of two apertures 64 through which fibre optic cables can be introduced into the interior chamber 23. Fibre optic couplings using fibre optic rods may be moulded in to deliver optical triggering to the FET switches to remove the need for oil/fluid tight seals which are prone to leak.

It will be appreciated that the annular chambers 54, 56 each have a concave rounded side wall 64 which is smooth over its surface with no sharp edges and is shaped to receive the annular inserts 58, 60 snugly.

The annular inserts 58, 60 each have a generally flat face 66 which, when in position in the end plate oppose one another. The faces 66, at least, are covered with a conductive coating, preferably a nickel film. In practice, the whole of the outer surface of the annular inserts may be covered in the conductive coating. The outer wall of the inserts are convex and follow the shape of the inner wall of the annular chambers of the end plate. In position on the end wall, the inserts are coaxial and the conductive coatings, substantially parallel on the end faces.

The annular inserts are formed of a non-conductive material and, for example, may be mounded from a plastics material such as an epoxy resin.

Each annular insert has a cylindrical chamber 70 which receives a primary or secondary transformer winding and core (FIG. 7), with the primary winding 102 and core on the outside of the end plate and the secondary winding 100 and core on the inside. The primary coil 102 and secondary coil 100 are illustrated, for example, in FIG. 4. LT power can then be supplied to the switch mechanism, which is at −55 kV, by magnetic coupling across the end plates despite the poor conductivity of the end plate.

It will be appreciated that coupling at −55 kV can generate considerable electric stresses. These may be dissipated by a combination of the conductive outer coating of the annular inserts together with an absence of sharp edges on the outer surface of the inserts. Thus, it is important that there is a smooth transition between the flat faces of the inserts and the convex side walls and it is important that there are no sudden changes in the radius of curvature.

Each of the inserts includes a pair of threaded inserts 72 which may be used to fasten a protective cover to retain the respective transformer winding.

The embodiment described allows power to be supplied to the switching stack, for example, to operate control circuitry. Typically, the power supplied is in the order of 100 W. By using magnetic coupling through the non-conductive end wall, the power can be supplied to circuitry that is floating at the −55 kV potential of the high voltage source. Furthermore, by use of a combination of a conductive coating and a smooth outer surface, the magnetically coupled inserts are not subject to unacceptable levels of electric stresses.

The annular elements are used as a convenient way of introducing a conductive surface between the respective transformer cores and the wall of the end plate. The bottom surface of the annular inserts is flat ensuring that the conductive surfaces are normal to the axis of the cores. It is preferred that the conductor chosen for the coating is also magnetic. Nickel based is a preferred material for the coating.

The conductive coating is not essential and could be omitted, in which case there is no need for the annular inserts. However, if omitted, all the components of the magnetic coupling would require very careful design to ensure that there are no sharp edges which could give rise to high electrical stresses at the high voltages at which the system operates. Such an arrangement, while possible is undesirable as it would be expensive requiring the design of very high precision components, particularly the transformer cores. The use of a conductive coating enables cheap, off the shelf transformer cores to be used whose shape would normally give rise to unacceptable electric stresses which the conductive coating can dissipate.

Various modifications to the embodiment described are possible and will occur to those skilled in the art without departing from the scope of the invention. For example, the shape of the inserts may be varied, within the constraint of the requirement that there are no sharp edges.

The invention claimed is:

1. A high voltage apparatus comprising a means for delivering high voltages to a load, and a housing in which the high voltage delivery means is arranged, wherein the housing includes a plurality of walls, one of which is non-conductive and includes a transformer for delivering a low voltage supply to a switch system, the transformer having a primary coil and core arranged in a first insert on a first side of the wall and a secondary coil and core arranged in a second insert on a second side of the wall, whereby power can be magnetically coupled across the wall, and wherein the first and second inserts have a conductive coating formed on the surfaces thereof and are arranged between the first side of the wall and the primary coil and core, and the second side of the wall and the secondary coil and core, and wherein the inserts are shaped to minimize electric stresses.

2. A high voltage apparatus according to claim 1, wherein the inserts are annular.

3. A voltage apparatus according to claim 1, wherein the primary coil and core are arranged on the outside of the non-conductive wall and the secondary coil and core are arranged on the inside of the non-conductive wall.

4. A high voltage apparatus according to claim 1, wherein the non-conductive wall is an end wall of the housing.

5. A high voltage apparatus according to claim 4, wherein the inserts are received snugly in respective chambers in either side of the non-conductive wall.

6. A high voltage apparatus according to claim 4, wherein the first and second inserts each include a chamber for receiving a respective one of the first and second coil and core.

7. A high voltage apparatus according to claim 6, wherein the inserts have a flat face on which the conductive coating is formed and a concave side wall, the transition between the side wall and the flat face being smooth.

8. A high voltage apparatus according to claim 7, wherein the conductive coatings on the flat faces are substantially parallel.

9. A high voltage apparatus according to claim 7, wherein the inserts are coaxial.

10. A high voltage apparatus according to claim 7, wherein the conductive coating extends over the side wall.

11. A high voltage apparatus according to claim 10, wherein the conductive coating is magnetic.

12. A high voltage apparatus according to claim 11, wherein the conductive coating includes nickel.

13. A high voltage apparatus according to claim 12, wherein the apparatus is a switching apparatus and the high voltage delivery means is a switching stack.

14. A high voltage apparatus according to claim 13, wherein the switching stack is coupled to a capacitor for delivering high voltage pulses to the load.

* * * * *